United States Patent
Javerliac et al.

(10) Patent No.: US 9,640,257 B2
(45) Date of Patent: May 2, 2017

(54) METHOD AND CIRCUIT FOR PROGRAMMING NON-VOLATILE MEMORY CELLS OF A VOLATILE/NON-VOLATILE MEMORY ARRAY

(71) Applicants: Commissariat à l'Énergie Atomique et aux Énergies Alternatives, Paris (FR); Centre National de la Recherche Scientifique, Paris (FR)

(72) Inventors: Virgile Javerliac, Grenoble (FR); Christophe Layer, Grenoble (FR)

(73) Assignees: Commissariat à l'Énergie Atomique et aux Énergies Alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 15/110,717

(22) PCT Filed: Jan. 7, 2015

(86) PCT No.: PCT/EP2015/050179
§ 371 (c)(1),
(2) Date: Jul. 8, 2016

(87) PCT Pub. No.: WO2015/104299
PCT Pub. Date: Jul. 16, 2015

(65) Prior Publication Data
US 2016/0329098 A1    Nov. 10, 2016

(30) Foreign Application Priority Data
Oct. 1, 2014  (FR) ...................................... 14 50198

(51) Int. Cl.
*G11C 5/08* (2006.01)
*G11C 14/00* (2006.01)
(Continued)

(52) U.S. Cl.
CPC .......... *G11C 14/009* (2013.01); *G11C 11/005* (2013.01); *G11C 11/1673* (2013.01);
(Continued)

(58) Field of Classification Search
CPC ............................. G11C 14/09; G11C 11/005
(Continued)

(56) References Cited

U.S. PATENT DOCUMENTS

2003/0117827 A1* 6/2003 Nishizaka ................ G11C 7/18
365/63
2006/0181916 A1  8/2006 Roehr
(Continued)

OTHER PUBLICATIONS

International Search Report, dated Mar. 18, 2015, from corresponding International Application No. PCT/EP2015/050179.
(Continued)

*Primary Examiner* — Harry W Byrne
(74) *Attorney, Agent, or Firm* — Wolf, Greenfield & Sacks, P.C.

(57) ABSTRACT

A memory array including: a first volatile memory cell including first and second cross-coupled inverters between first and second storage nodes; a first non-volatile memory cell including at least one resistive element that can be programmed to take one of at least two resistive states; and a control circuit adapted to couple the first non-volatile memory cell to the first and second storage nodes in order to generate a current for programming the resistive state of the at least one resistive element.

15 Claims, 6 Drawing Sheets

(51) Int. Cl.
    *G11C 11/00*     (2006.01)
    *G11C 11/16*     (2006.01)
    *G11C 11/419*     (2006.01)

(52) U.S. Cl.
    CPC ........ *G11C 11/1675* (2013.01); *G11C 11/419* (2013.01); *G11C 14/0081* (2013.01)

(58) Field of Classification Search
    USPC .......................................................... 365/66
    See application file for complete search history.

(56) References Cited

U.S. PATENT DOCUMENTS

| | | |
|---|---|---|
| 2007/0121371 A1 | 5/2007 | King |
| 2011/0122709 A1 | 5/2011 | Kim et al. |
| 2013/0135918 A1 | 5/2013 | Kushida |
| 2014/0078810 A1 | 3/2014 | Prenat et al. |

OTHER PUBLICATIONS

Haas et al.: "Magnetic Shadow RAM," (2006) American Semiconductor, Inc.; pp. 45-48.
Written Opinion, dated Mar. 18, 2015, from corresponding International Application No. PCT/EP2015/050179.

\* cited by examiner

METHOD AND CIRCUIT FOR PROGRAMMING NON-VOLATILE MEMORY CELLS OF A VOLATILE/NON-VOLATILE MEMORY ARRAY

CROSS-REFERENCE TO RELATED APPLICATIONS

This application is the national phase of International Application No. PCT/EP2015/050179, filed on Jan. 7, 2015, which claims priority to French patent application 14/50198, filed on Jan. 10, 2014, both of which applications are hereby incorporated by reference to the maximum extent allowable by law.

FIELD

The present disclosure relates to the field of memory arrays, and in particular to a memory array combining volatile and non-volatile data storage.

BACKGROUND

It has been proposed to use programmable resistive elements in memory cells to provide non-volatile data storage. Such resistive elements are programmable to adopt one of two different resistive states. The programmed resistive state is maintained even when a supply voltage of the memory cell is disconnected, and thus data can be stored by such elements in a non-volatile fashion.

Various types of resistive elements have been proposed, some of which are capable of being programmed by the direction of a current that is passed through the resistive element. An example of such a current-programmable resistive element is an STT (spin transfer torque) element, which is based on magnetic tunnelling junctions (MTJs).

A difficulty with the use of resistive elements for data storage is that read and write operations tend to be relatively slow, leading to a high access time with respect to a standard volatile memory such as an SRAM (static random access memory). To overcome this difficulty, it has been proposed to provide, in each memory cell, circuitry for programming the state of the resistive element and for reading, amplifying and storing a programmed resistive state. However, while such a solution leads to an improvement in access times, the surface area used by each memory cell, and the power consumption, tend to be high.

There is thus a need in the art for a non-volatile memory array having relatively low access times and/or a reduced surface area with respect to existing non-volatile memories.

SUMMARY

It is an aim of embodiments of the present description to at least partially address one or more needs in the prior art.

According to one aspect, there is provided a memory array comprising: a first volatile memory cell having first and second inverters cross-coupled between first and second storage nodes, the first storage node being coupled to a first bit line and the second storage node being coupled to a second bit line; a first non-volatile memory cell coupled between the first and second bit lines and having at least one resistive element programmable to have one of at least two resistive states; and a control circuit adapted to couple the first non-volatile memory cell to the first and second storage nodes to generate a current for programming the resistive state of the at least one resistive element.

According to one embodiment, the at least one resistive element is programmable by the direction of current passed through it to have one of said at least two resistive states.

According to one embodiment, the first non-volatile memory cell comprises first and second input nodes, and the control circuit is adapted to couple the first non-volatile memory cell to the first and second storage nodes by coupling the first input node to the first storage node and by coupling the second input node (224) to the second storage node.

According to one embodiment, the non-volatile memory cell comprises a single resistive element coupled in series with a first transistor between the first and second input nodes.

According to one embodiment, the control circuit is adapted to couple the first non-volatile memory cell to the first and second storage nodes by activating the first transistor.

According to one embodiment, the non-volatile memory cell comprises: a first resistive element coupled in series with a second transistor between the first input node and a first voltage level; and a second resistive element coupled in series with a third transistor between the second input node and the first voltage level.

According to one embodiment, the first volatile memory cell comprises: a fourth transistor coupled between the first storage node and the first input node of the non-volatile memory cell; a fifth transistor coupled between the second storage node and the second input node of the non-volatile memory cell, and the control circuit is adapted to couple the first non-volatile memory cell to the first and second storage nodes by activating the fourth and fifth transistors.

According to one embodiment, the first input node is connected to a first bit line; the second input node is connected to a second bit line; the first storage node is coupled to the first bit line via said fourth transistor; and the second storage node is coupled to the second bit line via the fifth transistor.

According to one embodiment, the first input node is connected to a first internal node; the second input node is connected to a second internal node; the first storage node is coupled to the first internal node via the fourth transistor; the second storage node is coupled to the second internal node via the fifth transistor; the first internal node is coupled to a first bit line via a sixth transistor; the second internal node is coupled to a second bit line via a seventh transistor; and the control circuit is adapted to deactivate the sixth and seventh transistors while coupling the first non-volatile memory cell to the first and second storage nodes.

According to one embodiment, the memory array further comprises: a second volatile memory cell having third and fourth inverters cross-coupled between third and fourth storage nodes, the third storage node being coupled to the first internal node via an eighth transistor and the fourth storage node being coupled to the second internal node via a ninth transistor; and a second non-volatile memory cell having: at least one resistive element programmable to have one of at least two resistive states; a third input node connected to the first internal node; and a fourth input node connected to the second internal node.

According to one embodiment, the memory array further comprises a read/write circuit adapted to read from the first non-volatile memory cell a programmed resistive state representing a first data bit and write the first data bit to the first volatile memory cell.

According to one embodiment, each of the volatile memory cells is coupled to a voltage supply rail coupled via a switch to a supply voltage level.

According to one embodiment, at least one resistive element of each of the non-volatile memory cells is one of: a spin transfer torque element with in-plane anisotropy; a spin transfer torque element with perpendicular-to-plane anisotropy; and a reduction oxide element.

According to a further aspect, there is provided a method of data back-up in the above memory array, the method comprising: coupling, by a control circuit, the first non-volatile memory cell to the first and second storage nodes to generate a current for programming the resistive state of the at least one resistive element.

According to a further aspect, there is provided a method of restoring data in the above memory array, the method comprising: reading from the first non-volatile memory cell a programmed resistive state representing a first data bit; and writing the first data bit to the first volatile memory cell.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to refer to a direct connection between one element and another, while the term "coupled" implies that the connection between the two elements may be direct, or via an intermediate element, such as a transistor, resistor or other component.

Figure 1:
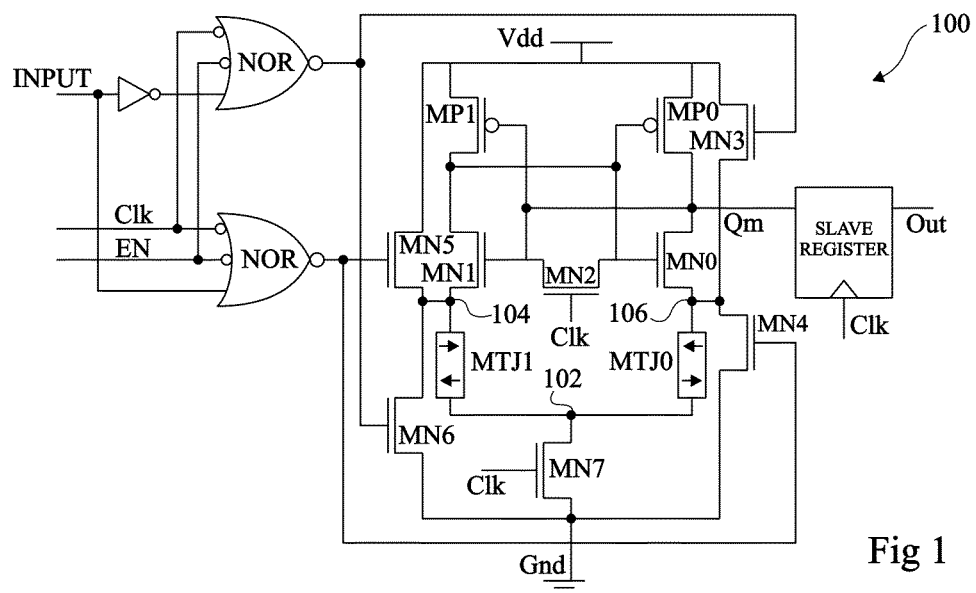
FIG. 1 schematically illustrates an example of a non-volatile flip-flop.

FIG. 1 substantially reproduces FIG. 7 of the publication entitled "Spin-MTJ based Non-Volatile Flip-Flop", Weisheng Zhao et al., Proceedings of the 7th IEEE International Conference on Nanotechnology, Aug. 2-5, 2007, Hong-Kong.

The flip-flop 100 represented in FIG. 1 comprises a master register and a slave register (SLAVE REGISTER). The master register comprises magnetic tunnel junction devices MTJ1 and MTJ0, programmable by the direction of a current passed through them. Device MTJ1 is connected between an intermediate node 104 and an interconnection node 102. Device MTJ0 is connected between an intermediate node 106 and the interconnection node 102. The interconnection node 102 connects together the MTJ devices MTJ0 and MTJ1. The intermediate node 104 is further coupled to a supply voltage Vdd via a pair of transistors MN1 and MP1 coupled in series and forming a first inverter. The intermediate node 106 is further coupled to the supply voltage Vdd via a pair of transistors MP0 and MN0 coupled in series and forming a second inverter. The first and second inverters are cross-coupled with each other, and the output of the second inverter is connected to the slave register. A transistor MN2 is coupled between the gate nodes of transistors MN1 and MN0.

A transistor MN5 is coupled between the intermediate node 104 and the supply voltage Vdd, and a transistor MN6 is coupled between the intermediate node 104 and ground. Furthermore, a transistor MN3 is coupled between the intermediate node 106 and the supply voltage Vdd, and a transistor MN4 is coupled between the intermediate node 106 and ground. A transistor MN7 is coupled between the intermediate node 102 and ground. The transistors MN3 to MN6 permit a current to be passed through the resistive elements MTJ1 and MTJ0 in one direction or the other in order to program the resistive states of the MJT devices. During this programming phase, the transistor MN7 is used to disconnect the node 102 from ground. A pair of NOR gates and an inverter on the left-hand side of FIG. 1, which are controlled by an input signal INPUT, a clock signal Clk and an enable signal EN, generate signals for controlling the transistors MN3 to MN6. When the transistor MN7 is activated, the transistors MP0, MP1, MN0 and MN1 form a sense amplifier for reading the states of the elements MTJ0 and MTJ1.

The memory cell forming the master register of FIG. 1 is not suitable for use in a memory array in view of its relatively high number of transistors. Furthermore, the transistors forming the sense amplifier are relatively large, because they must be able to conduct sufficient current to permit the resistive states of the elements MTJ0 and MTJ1 to be detected.

Figure 2:
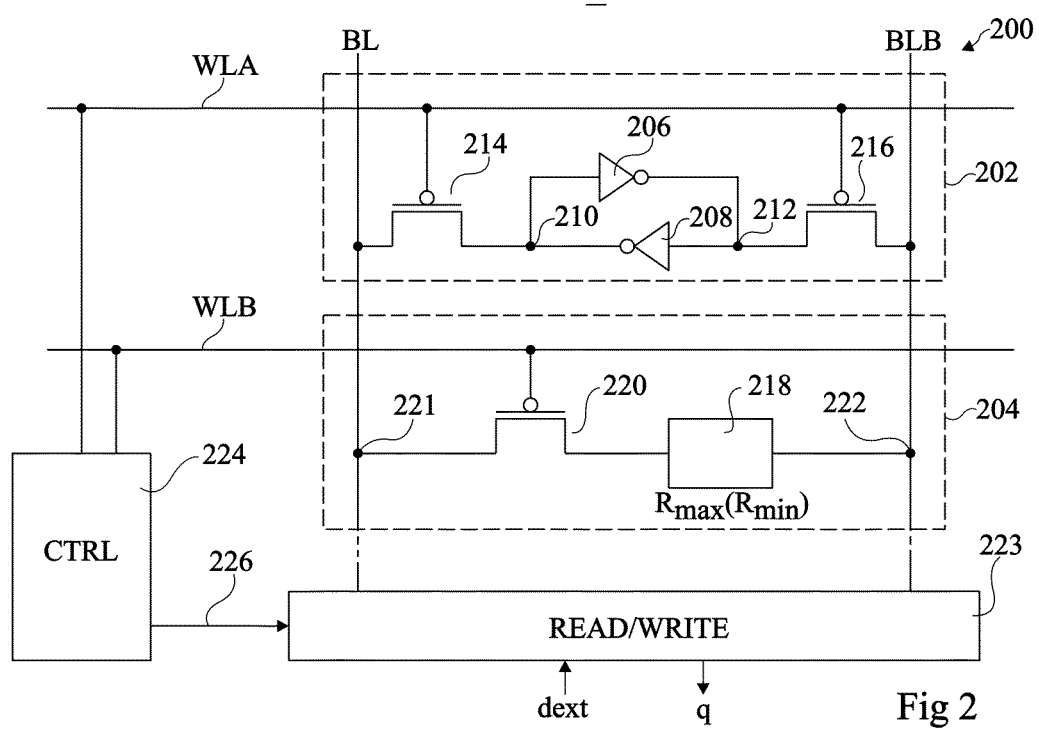
FIG. 2 schematically illustrates part of a non-volatile/volatile memory array according to an example embodiment.

FIG. 2 schematically illustrates circuitry 200 associated with one column of a combined non-volatile/volatile memory array according to an example embodiment of the present disclosure.

The circuitry 200 comprises a volatile memory cell 202, and a non-volatile memory cell 204 associated with the volatile memory cell 202. As it will become apparent hereafter, the volatile and non-volatile memory cells are associated with each other in that, at least some of the time, the non-volatile memory cell 204 stores a back-up of a data bit held by the volatile memory cell 202, and may be used to restore this data bit to the volatile memory cell 202. In the example of FIG. 2, the memory cells 202, 204 are coupled between a same pair of bit lines BL, BLB.

While FIG. 2 illustrates a single volatile memory cell 202 and a single non-volatile cell 204, the column may comprise any number of volatile cells and associated non-volatile cells coupled between the bit lines BL and BLB. Furthermore, while a single column is illustrated in FIG. 2, the memory array may comprise any number of columns of the type shown in FIG. 2, each with a corresponding read/write circuit described in more detail below.

The volatile memory cell 202 is for example an SRAM (static random access memory) cell, comprising a latch formed of a pair of inverters 206, 208 cross-coupled between storage nodes 210, 212. A transistor 214, which is for example a PMOS transistor, couples the storage node 210 to the bit line BL. A transistor 216, which is also for example a PMOS transistor, couples the storage node 212 to the bit line BLB. The transistors 214 and 216 are for example controlled by a row selection line WLA of the memory array.

The non-volatile memory cell 204 for example comprises a programmable resistive element 218 coupled in series with a transistor 220, which is for example a PMOS transistor, between input nodes 221, 222 of the cell. In the example of FIG. 2, these input nodes 221, 222 are connected to the bit lines BL and BLB respectively. The transistor 220 is for example controlled by a row selection line WLB of the memory array.

The resistive element 218 is for example any type of resistance switching element for which the resistance is programmable by the direction of a current passed through it. The resistive element 218 is for example an STT (spin-torque-transfer) element with in-plane or perpendicular-to-plane anisotropy, as described in more detail in the publication entitled "Magnonic spin-transfer torque MRAM with low power, high speed, and error-free switching", N. Mojumder et al., IEDM Tech. Digest (2010), and in the publication entitled "Electric toggling of magnets", E. Tsymbal, Natural Materials Vol 11, January 2012. Alternatively, the resistive elements could be those used in RedOx RAM (reduction oxide RAM) resistive switching memories, which are for example described in more detail in the publication entitled "Redox-Based Resistive Switching Memories—Nanoionic Mechanisms, Prospects and Challenges", Rainer Waser et al., Advanced Materials 2009, 21, pages 2632 to 2663.

Whatever the type of resistive element, a bit of data is for example stored in a non-volatile manner by programming the element to have either a relative high resistance (Rmax) or a relatively low resistance (Rmin). The resistive element 218 for example has just two resistive states corresponding to the high and low resistances Rmax and Rmin, but the exact values of Rmin and Rmax may vary depending on conditions such as process, materials, temperature variations etc. The resistive element 218 is for example selected such that Rmax is always significantly greater than Rmin, for example at least 20 percent greater. In general, the ratio between the resistance Rmax and the resistance Rmin is for example between 1.2 and 10000. Rmin is for example in the region of 2 k ohms or less, and Rmax is for example in the region of 6 k ohms or more, although many other values are possible.

The bit lines BL and BLB are coupled to a read/write circuit (READ/WRITE) 223. A control circuit 224 provides control signals on a line 226 to the read/write circuit 223, and to the selection lines WLA and WLB.

The read/write circuit 223 is capable of reading a bit of data from the volatile memory cell 202, for example by pre-charging the bit lines BL and BLB with a high voltage, and detecting a voltage drop on one or the other of the bits when the signal WLA is asserted by the control circuit 224. The read/write circuit 223 is also capable of reading a bit of data from the non-volatile memory cell 204, for example by applying a voltage across the bit lines BL, BLB while the signal WLB is asserted by the control circuit 224, in order to generate a current through the resistive element 218. The level of this current is for example compared to a reference current in order to determine the programmed resistive state of the element 218. The data read from the non-volatile memory cell 202 or volatile memory cell 204 can be supplied as a signal q at an output of the read/write circuit 223, and/or written to one of the volatile memory cells during a restore operation, as will be explained in more detail.

During a data back-up phase, the control circuit 224 is capable of controlling the volatile and non-volatile memory cells of the array such that data is transferred from the volatile memory cell 202 to the associated non-volatile memory cell 204. In particular, the control circuit 224 asserts the selection signals WLA and WLB, such that transistors 214, 216 and 220 of the memory cells 202 and 204 are activated. The storage nodes 210, 212 are thus respectively coupled to the input nodes 221, 222 of the non-volatile memory cell 204, and a write current will flow in one direction or the other through the resistive element 218 to program its state, depending on the data held by the storage nodes 210, 212. Depending on the type and dimensions of the resistive element 218, the size of the transistors forming the inverters 206, 208 of the volatile memory cell 202 are for example chosen in order to generate a write current in the range of 10 to 500 µA.

The read/write circuit 223 is also capable of writing a bit of data to the volatile memory cell 202 via the bit lines BL and BLB. This data may be external data dext provided to the read/write circuit 223, or internal data read from one of the other memory cells, for example the non-volatile memory cell 202. For example, during a restore phase, a bit of data is read by the read/write circuit 223 from the non-volatile memory cell 204, and written to the volatile memory cell 202. The write operation involves applying by the read/write circuit 223 a high voltage to the bit line BL and a low voltage to the bit line BLB, or vice versa, depending on the data to be written. The control circuit 224 then asserts the signal WLA, for example to a low level, to activate the transistors 214, 216, such that the latch formed by the inverters 206, 208 is programmed based on the voltages on the bit lines BL, BLB.

While FIG. 2 shows one example of the circuits forming the volatile and non-volatile memory cells 202, 204, it will be apparent to those skilled in the art that in alternative embodiments, different circuits could be used.

Figure 3:
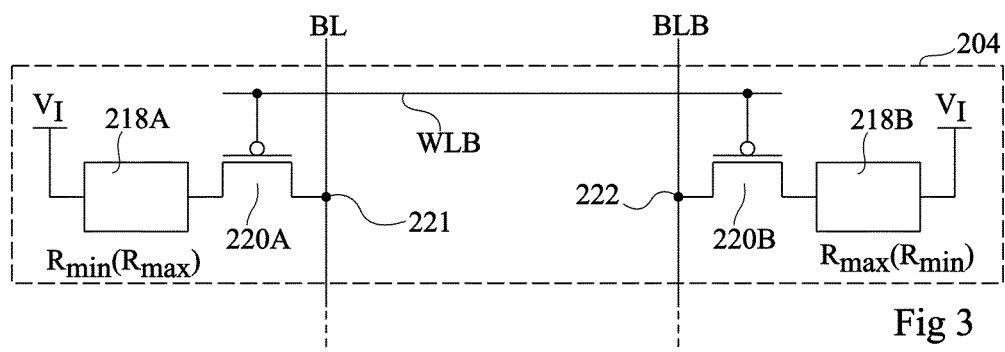
FIG. 3 schematically illustrates a non-volatile memory cell according to an example embodiment.

FIG. 3 illustrates the non-volatile memory cell 204 according to an alternative embodiment to the one shown in FIG. 2. In particular, rather than comprising a single resistive element 218, the circuit of FIG. 3 comprises a pair of resistive elements 218A, 218B. The element 218A is coupled in series with a transistor 220A, which is for example a PMOS transistor, between the bit line BL and an intermediate supply voltage VI. Similarly, the element 218B is coupled in series with a transistor 220B, which is for example a PMOS transistor, between the bit line BLB and the intermediate supply voltage VI. For example, the resistive elements 218A, 218B each have one of their nodes coupled to the voltage VI, and their other node coupled to the corresponding bit line. As will be described in more detail below, the intermediate supply voltage VI is for example at or close to half the value of supply voltage VDD. The transistors 220A, 220B are for example controlled by the selection line WLB.

The non-volatile data bit represented by the resistive elements 218A, 218B depends on which of the resistive elements is at the resistance Rmax and Rmin, in other words on the relative resistances. The values of Rmax and Rmin are for example the same as for the resistive element 218 of FIG. 2 described above. In FIG. 3, the resistive element 218A is shown programmed to have a resistance Rmin and the element 218B a resistance Rmax, and as shown by the references Rmax and Rmin in brackets, the opposite programming of the resistance values would be possible.

In operation, the read/write circuit 223 of FIG. 2 writes to the non-volatile memory cell 204 of FIG. 3 in the same way as described above in relation to FIG. 2, by asserting the row select signals WLA and WLB. Thus both the transistors 220A and 220B will be activated, causing currents to flow through each of the resistive elements 218A, 218B. The high voltage at the storage node 210 or 212 is for example at a VDD level of between 2 and 3 V, the low voltage at the other of the storage nodes 210, 212 is for example at ground, and the intermediate voltage VI is for example at around VDD/2, for example between 1 and 1.5 V. Thus a current will through each of the resistive elements 218A, 218B in a different direction depending on the data stored at the storage nodes.

The read/write circuit 223 reads the relative resistive state of the resistive elements 218A, 218B by applying a voltage, for example at the supply voltage VDD or ground, to each of the bit lines BL, BLB, while the signal WLB is asserted, and then comparing, using a comparator, the current level flowing to or from each bit line.

Figure 4:
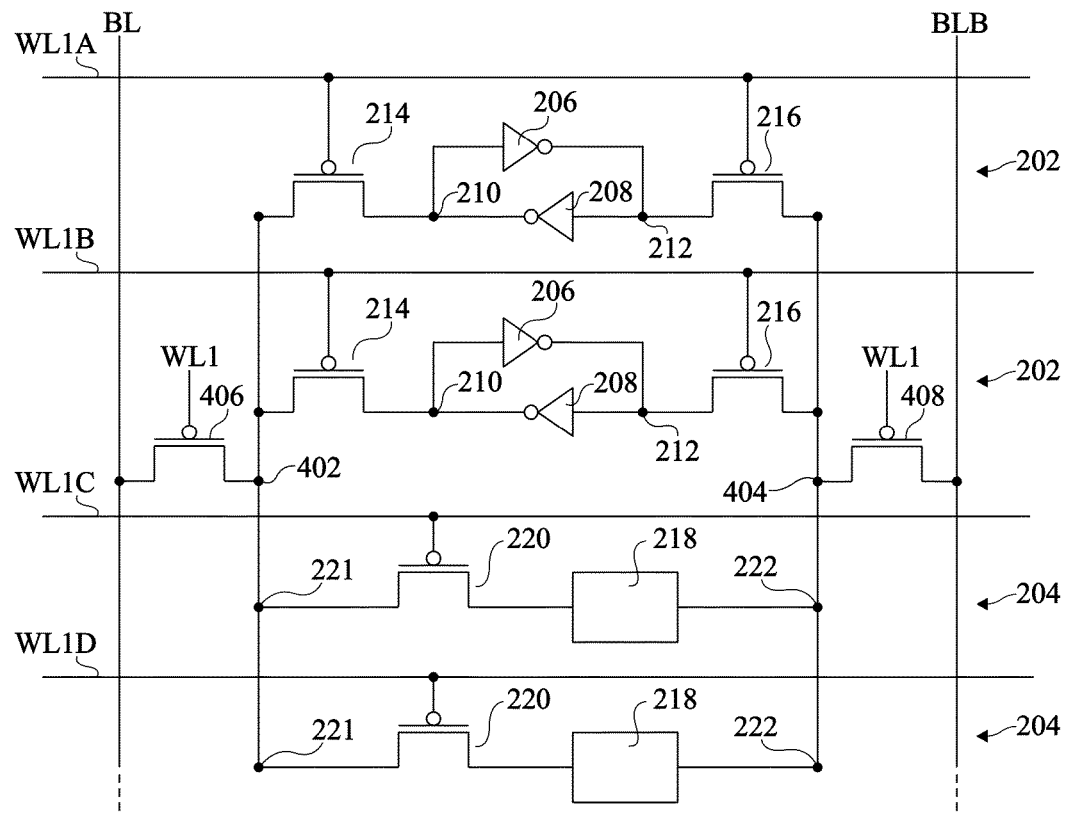
FIG. 4 schematically illustrates an arrangement of volatile and non-volatile memory cells according to a further example embodiment.

FIG. 4 schematically illustrates an arrangement of volatile and non-volatile memory cells 202, 204 according to an alternative example to that of FIG. 2 in which a group of the memory cells in a column are coupled between internal nodes 402, 404. In the example of FIG. 4, the group of memory cells comprises two volatile memory cells 202 and two non-volatile memory cells 204 coupled between the internal nodes 402, 404. In alternative embodiments, there could be more than two volatile and non-volatile memory cells. The internal node 402 is coupled to the bit line BL via a PMOS transistor 406, and the internal node 404 is coupled to the bit line BLB via a PMOS transistor 408. The transistors 406, 408 are controlled by a group selection signal WL1, while the memory cells respectively receive selection signals WL1A, WL1B, WL1C and WL1D.

While not shown in FIG. 4, there may be further groups of volatile and non-volatile memory cells coupled between the bit lines BL, BLB.

In operation, during a read or write operation of the memory cells 202, 204, the transistors 406, 408 are activated in addition to the transistors 214, 216 or 220. However, when data is to be transferred from one of the volatile memory cells to one of the non-volatile memory cells, the transistors 406, 408 remain deactivated. In this way, such a data transfer operation may be performed at the same time in each of the groups of memory cells coupled to the same bit lines BL and BLB.

Figure 5:
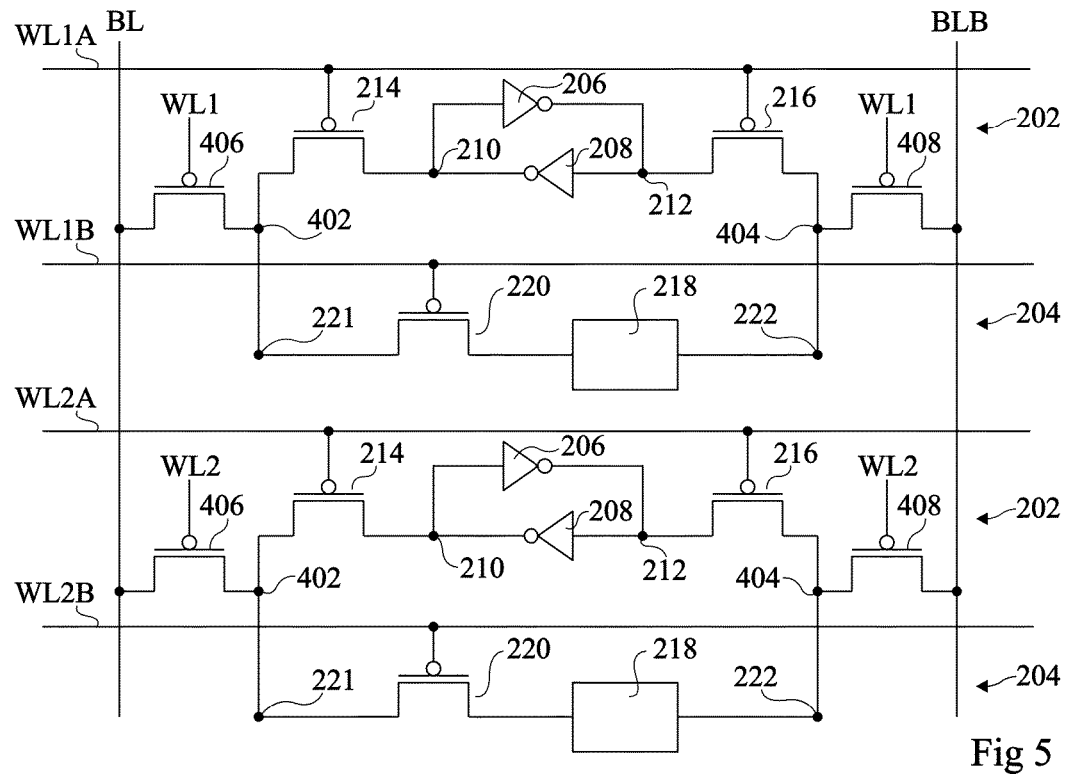
FIG. 5 schematically illustrates an arrangement of volatile and non-volatile memory cells according to example embodiments.

FIG. 5 schematically illustrates volatile and non-volatile memory cells 202, 204 according to an alternative embodiment similar to that of FIG. 4, except that each group of memory cells comprises just two memory cells, one volatile memory cell 202 and one associated non-volatile memory cell 204. In such an arrangement, the data bits stored by all of the volatile memory cells 202 of each column of the memory array may all be transferred at the same time to their associated non-volatile memory cell 204. Indeed, a first group of memory cells in FIG. 5 are controlled by selection signals WL1, WL1A and WL1B, and a second group of memory cells are controlled by selection signals WL2, WL2A and WL2B.

It will be appreciated that the non-volatile memory cells 204 of FIG. 4 or 5 could be implemented by the circuit of FIG. 3, the transistors 220A, 220B being coupled to the internal nodes 402, 404.

Figure 6:
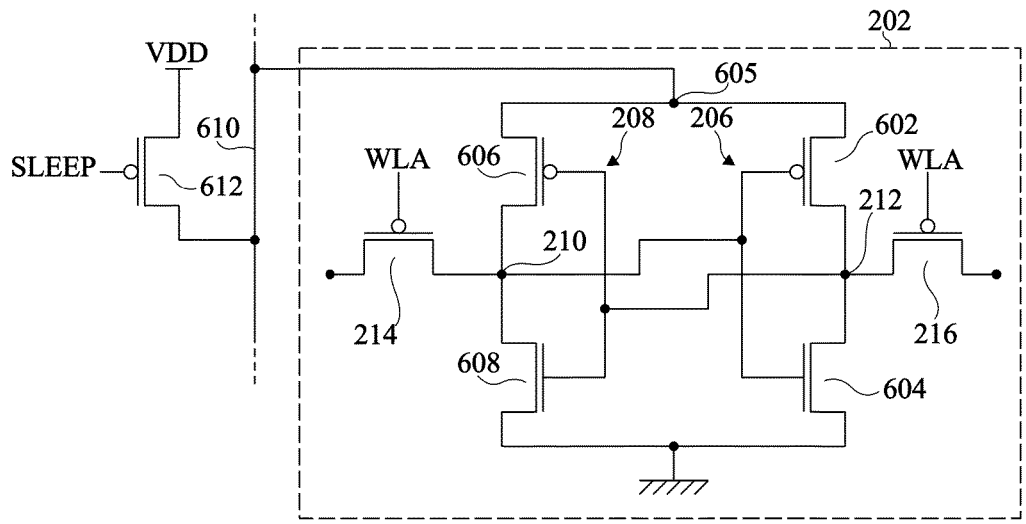
FIG. 6 schematically illustrates a volatile memory cell in more detail according to an example embodiment.

FIG. 6 illustrates one of the volatile memory cells 202 in more detail according to an example embodiment. The inverter 206 is for example formed by a PMOS transistor 602 and an NMOS transistor 604 coupled in series between a supply node 605 and ground. The control nodes of transistors 602, 604 are coupled to the storage node 210, and an intermediate node between these transistors forms the storage node 212. Similarly, the inverter 208 is for example formed by a PMOS transistor 606 and an NMOS transistor 608 coupled in series between the supply node 605 and ground. The control nodes of transistors 606, 608 are coupled to the storage node 212, and an intermediate node between these transistors forms the storage node 210.

The supply node 605 is for example coupled to a voltage supply rail 610, which is in turn coupled to a supply voltage VDD via a PMOS transistor 612 controlled by a sleep signal SLEEP. The supply rail 610 for example supplies all of the volatile memory cells of the column, and thus by deactivating the transistor 612, the volatile memory cells can be powered down to conserve energy. In particular, prior to entering a sleep mode, the data from each of the volatile memory cells 202 is for example backed-up to its associated non-volatile memory cell 204, and then the volatile memory cells are powered down by deactivating the transistor 612. At the end of the sleep period, the transistor 612 is for example activated to power-up the volatile memory cells 202, and the data stored by each non-volatile memory cells 204 is for example restored to its associated volatile memory cell.

Figure 7A:
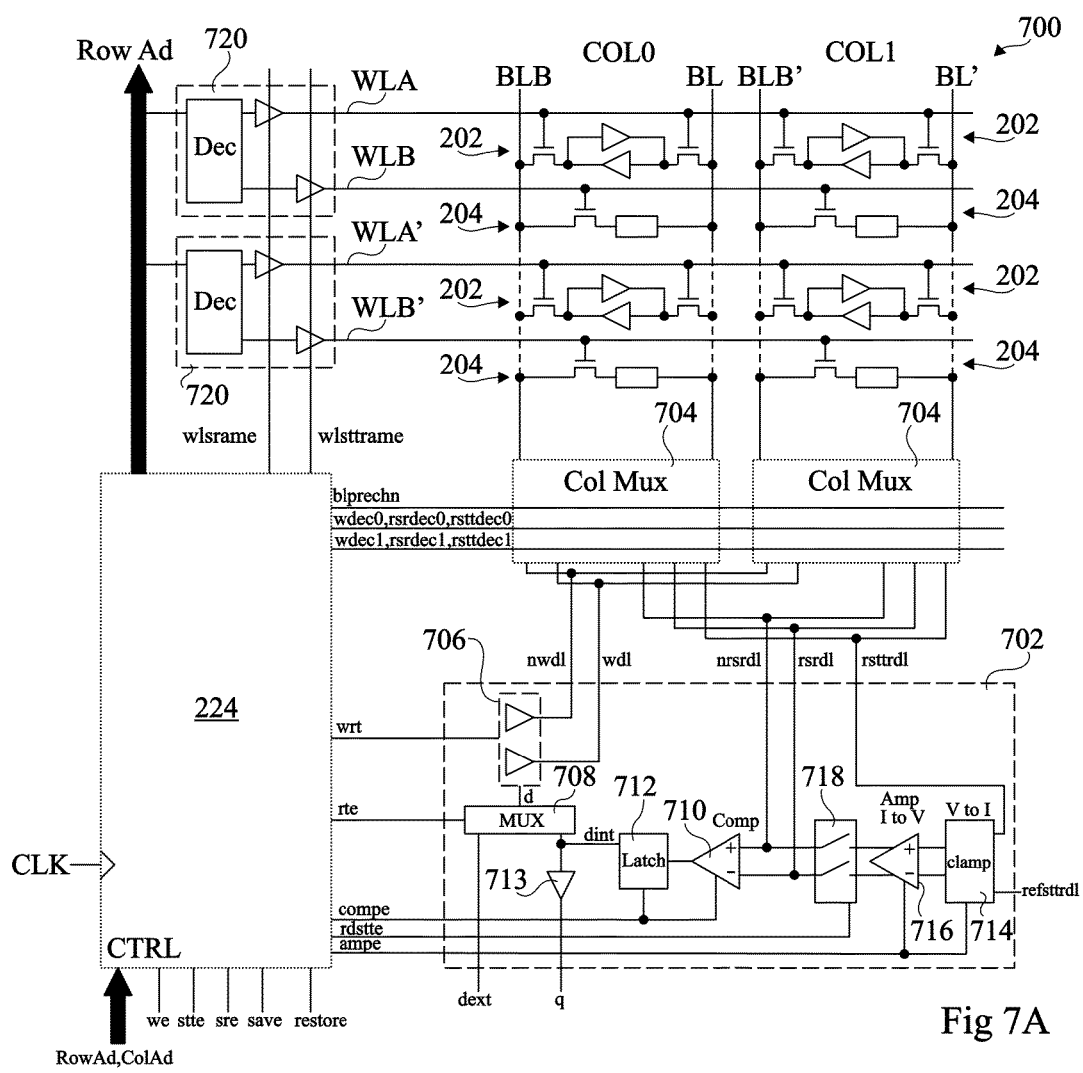
FIG. 7A schematically illustrates a non-volatile/volatile memory device according to an example embodiment.

FIG. 7A schematically illustrates a memory device 700 comprising the circuitry 200 of FIG. 2 according to an example embodiment. It will be apparent to those skilled in the art how this device could be adapted to operate based on the memory cells of FIG. 3.

Two columns COL0 and COL1 are illustrated in FIG. 7, and two volatile memory cells 202 and two non-volatile memory cells 204 are illustrated in each column, although in alternative embodiments there could be any number of columns and any number of memory cells in each column.

The read/write circuit comprises a read/write module 702, and a column multiplexer (Col Mux) 704 associated with each column. Thus in the embodiment of FIG. 7A, the read/write module 702 is associated with more than one column of the memory array. In alternative embodiments, a separate read/write module 702 could be provided for each column of the array.

Figure 7B:
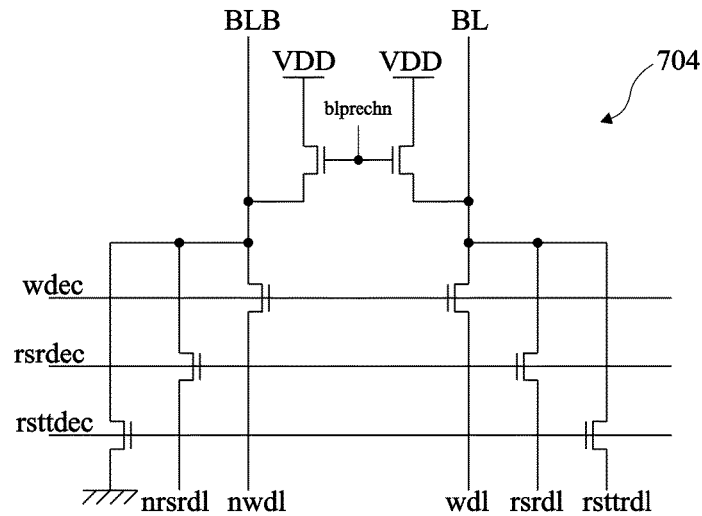
FIG. 7B schematically illustrates a column multiplexer of the memory device of FIG. 7A in more detail according to an example embodiment.

FIG. 7B illustrates one of the column multiplexers 704 in more detail according to an example embodiment. With reference to both FIGS. 7A and 7B, the column multiplexer 704 of column COL0 selectively couples the bit lines BL, BLB respectively to:

complementary write lines wdl and nwdl when a write signal wdec0 of column COL0 is asserted;

to a supply voltage VDD to precharge the bit lines before a volatile cell is to be read when a precharge signal blprechn is asserted;

to complementary volatile cell read lines rsrdl, nrsrdl when a volatile read signal rsrdec0 of column COL0 is asserted; and to a non-volatile read line rsttrdl and a read voltage level, for example at ground, when a non-volatile read signal rsttdec0 is asserted.

The column multiplexer 704 for example comprises:

two PMOS transistors controlled by the signal blprechn for respectively coupling the bit lines BL and BLB to the supply voltage VDD;

two NMOS transistors controlled by the signal wdec for respectively coupling the bit lines BL and BLB to the write lines wdl and nwdl;

two NMOS transistors controlled by the signal rsrdec for respectively coupling the bit lines BL and BLB to the volatile read lines rsrdl and nrsrdl; and two NMOS transistors controlled by the signal rsttdec for respectively coupling the bit lines BL and BLB to the non-volatile read line rsttrdl and ground.

Referring again to FIG. 7A, the read/write module 702 comprises a write circuit 706, which generates voltages to be applied to the bit lines of a selected column based on a write signal wrt from the control block 224, and a data signal d from a data multiplexer 708. The data multiplexer 708 selects either external data dext received from outside the memory array, or internal data dint read from a memory cell of the array, based on a restore signal rte.

The read/write module 702 also comprises a comparator (Comp) 710, having positive and negative inputs respectively coupled to the volatile cell read lines nrsrdl and rsrdl. An output of the comparator 710 is coupled to a data latch (Latch) 712, which in turn provides the internal data signal dint. The comparator 710 and latch 712 each receive a timing signal compe. The internal data signal dint is provided via an output buffer 713 as the output data signal q of the read/write module 702.

The non-volatile cell read line rsttrdl is coupled to a voltage clamping circuit (clamp) 714, which applies a voltage level to the line rsttrdl in order to generate a current through the resistive element of a selected non-volatile memory cell 204. Similarly, the voltage clamping circuit 714 also for example applies a voltage to a reference line refsttrdl coupled to a reference device (not illustrated) such that a reference current is generated. The reference device for example has a resistance equal to (Rmax+Rmin)/2, such that the reference current provides a cut-off level for determining whether the resistive element has a programmed resistance of Rmin or Rmax. The currents generated by the voltage clamping circuit 714 are converted into voltage levels and amplified by an amplifier 716. The voltage clamping circuit 714 and amplifier 716 for example receive a timing signal ampe.

The amplifier 716 provides differential voltage outputs, which are in turn coupled via switches 718 to the inputs of the comparator 710. The switches 718 are controlled by a non-volatile read control signal rdstte from the control block 224.

A row decoder 720 is for example associated with each pair of volatile/non-volatile rows of the memory array. Row decoder 720 receives a row address, and when the address corresponds to the address of the row, asserts the corresponding row control signal WLA when a volatile row selection signal wlsrame is asserted, or asserts the corresponding row control signal WLB when a non-volatile row selection signal wlsttrame is asserted.

The control block 224 receive a clock signal clk, a row address signal Row Ad, a column address signal Col Ad, a write enable signal we, a non-volatile cell selection signal stte, a volatile cell selection signal sre, a save signal save, and a restore signal restore.

Operation of the memory 700 will now be described with reference to FIG. 8.

Figure 8:
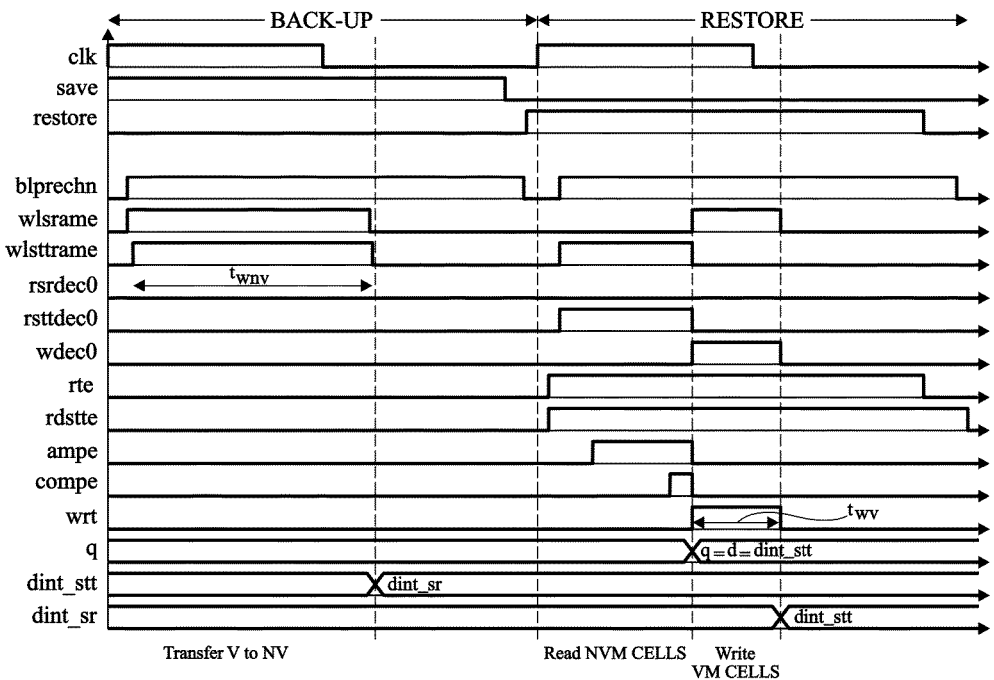
FIG. 8 is a timing diagram showing examples of signals in the memory array of FIG. 7A according to an example embodiment.

FIG. 8 is a timing diagram illustrating examples of the signals clk, save, restore, blprechn, wlsrame, wlsttrame, rsrdec0, rsttdec0, wdec0, rte, rdstte, ampe, compe, wrt, q, dint_stt and dint_sr, in the memory array 700 of FIG. 7A during a back-up and a restore operation between the volatile and non-volatile memory cells of column COL0 of FIG. 7A. The signal dint_stt corresponds to the data stored by the non-volatile memory cell 204 and the signal dint_sr corresponds to the data stored by the volatile memory cell 202.

The back-up operation is triggered by a high value of the signal save, and involves applying the selection signals wlsrame and wlsttrame of the volatile and non-volatile memory cells between which the transfer is to take place. After a write time twnv, the signals wlsrame and wlsttrame go low, and the data dint_stt stored by the non-volatile memory cell becomes equal to the volatile data dint_sr.

The restore operation is triggered by a high value of the restore signal, and starts with a read operation of the data dint_stt stored by the non-volatile memory cell. During the restore operation, the signal rte is high, such that the data written to the volatile memory cell is the internal data dint that has been read from the non-volatile memory cell.

The signal wlsttrame goes high to assert the signal WLB and select the non-volatile memory cell, and rsttdec0 goes high to couple the bit lines to ground and to the read data line rsttrdl. The timing signal ampe then goes high to activate the voltage clamp 714 and the amplifier 716, and the timing signal compe then goes high to store the data signal to the latch 712. On the falling edge of the signal compe, the q signal transitions to the non-volatile cell data signal dint_stt.

The restore operation then involves a write operation to the volatile cell. Thus the signals wlsrame and wdec0 are high, and the write signal wrt also goes high. After a write time twv, which is for example shorter than the write time twnv of the non-volatile cell, the write signal wrt goes low, and the data dint_sr stored by the non-volatile memory cell becomes equal to the non-volatile data dint_stt.

Figure 9:
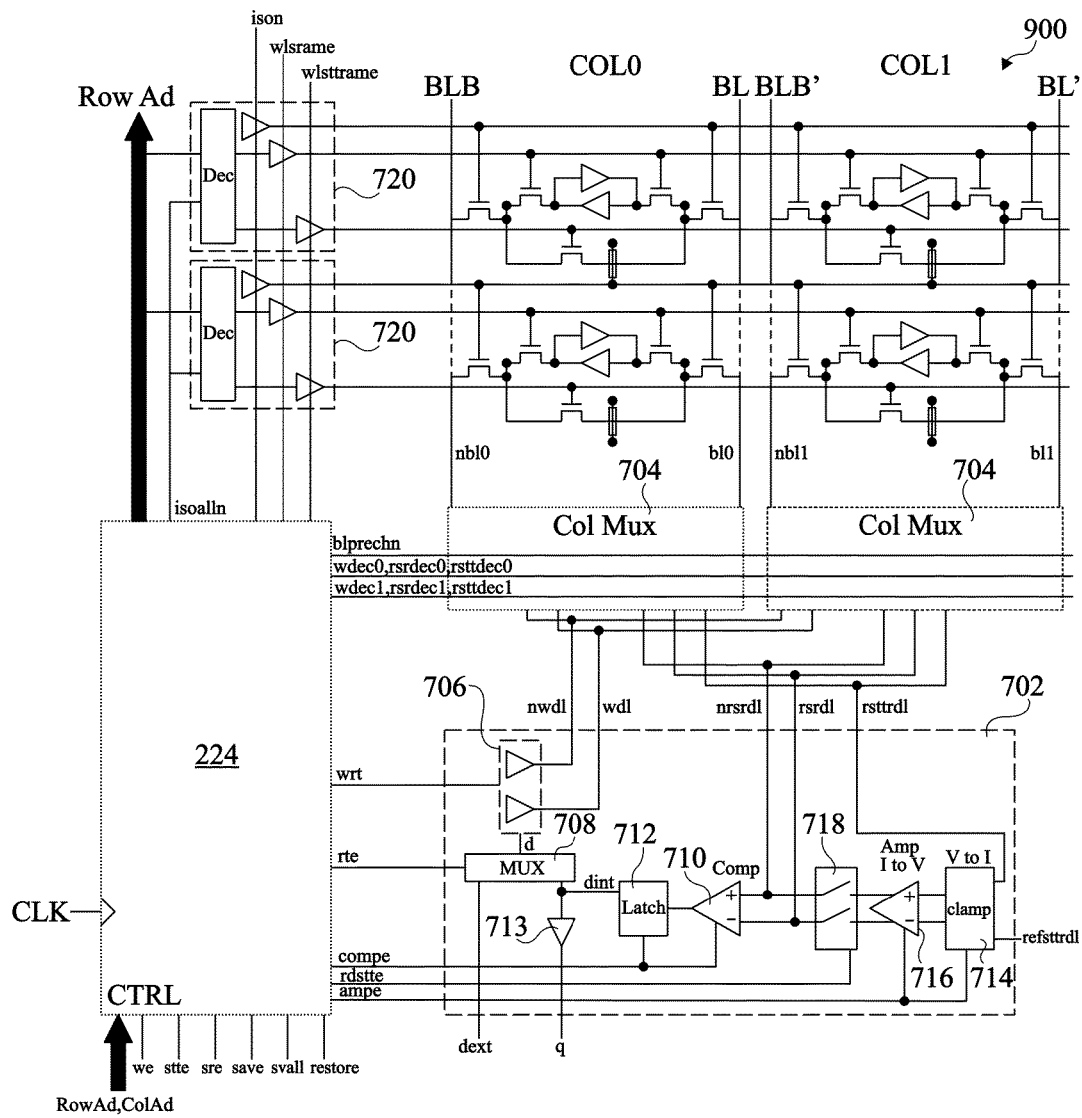
FIG. 9 schematically illustrates a non-volatile/volatile memory device according to a further example embodiment.

FIG. 9 schematically illustrates a memory device 900 very similar to that of FIG. 7, and like features are labelled with like reference numerals and will not be described again in detail. A difference is that the volatile and non-volatile memory cells 202, 204 of FIG. 9 are coupled in pairs, like in the embodiment of FIG. 5 described above. The row decoders receive a further isolation signal isoalln indicating when a back-up operation is to be performed and the memory cells are to be isolated from the corresponding bit lines. Furthermore, in addition to the selection signal wlsrame and wlsttrame, a further selection signal ison selects one of the groups of memory cells during a read or write operation of the volatile memory cells. The control circuit 224 additionally receives a signal svall indicating when a back-up operation is to be performed on all of the volatile memory cells of the array.

Figure 10:
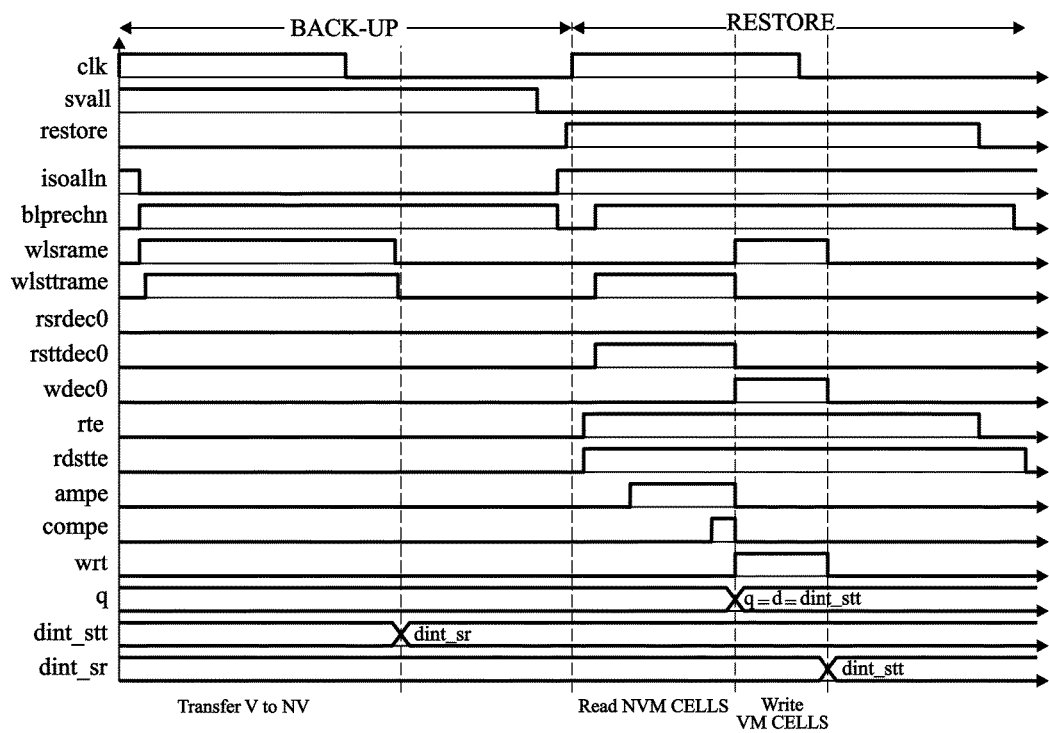
FIG. 10 is a timing diagram showing examples of signals in the memory device of FIG. 9 according to an example embodiment.

FIG. 10 is a timing diagram illustrating examples of the signals clk, svall, restore, isoalln, blprechn, wlsrame, wlsttrame, rsrdec0, rsttdec0, wdec0, rte, rdstte, ampe, compe, wrt, q, dint_stt and dint_sr, in the memory array 900 of FIG. 9 during a back-up and a restore operation between the volatile and non-volatile memory cells of column COL0. The difference with respect to the timing diagram of FIG. 8 is that the back-up all signal svall triggers the back-up operation, and during this operation, the signal isoalln is brought low to isolate the memory cells from the bit lines.

An advantage of the embodiments described herein is that, by coupling the storage nodes of a volatile memory cell to input nodes of a non-volatile memory cell, a back-up operation in which the non-volatile memory cell is written can be implemented in a simple fashion without the use of dedicated write circuitry in the memory array. Furthermore, in such a circuit, a common read and/or write circuit can be provided for the volatile and non-volatile memory cells, and thus each memory cell can be implemented with relatively few transistors and no sense amplifier.

Having thus described at least one illustrative embodiment, various alterations, modifications and improvements will readily occur to those skilled in the art.

For example, it will be apparent to those skilled in the art that the supply voltage VDD in the various embodiments could be at any level, for example between 1 and 3 V, and rather that being at 0 V, the ground voltage can also be considered as a supply voltage that could be at any level, such as a negative level.

Furthermore, it will be apparent to those skilled in the art that, in any of the embodiments described herein, all of the NMOS transistors could be replaced by PMOS transistors and/or all of the PMOS transistors could be replaced by NMOS transistors. It will be apparent to those skilled in the art how any of the circuits could be implemented using only PMOS or only NMOS transistors. Furthermore, while transistors based on MOS technology are described throughout, in alternative embodiments other transistor technologies could be used, such as bipolar technology.

Furthermore, it will be apparent to those skilled in the art that the various features described in relation to the various embodiments could be combined, in alternative embodiments, in any combination.

The invention claimed is:

1. A memory array comprising:
   a first volatile memory cell having first and second inverters cross-coupled between first and second storage nodes, the first storage node being coupled to the first bit line and the second storage node being coupled to the second bit line;
   a first non-volatile memory cell coupled between the first and second bit lines and having at least one resistive element programmable to have one of at least two resistive states; and
   a control circuit adapted to couple the first non-volatile memory cell to the first and second storage nodes to generate a current for programming the resistive state of the at least one resistive element.

2. The memory array of claim 1, wherein the at least one resistive element is programmable by the direction of current passed through it to have one of said at least two resistive states.

3. The memory array of claim 1, wherein the first non-volatile memory cell comprises first and second input nodes, and wherein the control circuit is adapted to couple the first non-volatile memory cell to the first and second storage nodes by coupling the first input node to the first storage node and by coupling the second input node to the second storage node.

4. The memory array of claim 3, wherein the non-volatile memory cell comprises a single resistive element coupled in series with a first transistor between the first and second input nodes.

5. The memory array of claim 4, wherein the control circuit is adapted to couple the first non-volatile memory cell to the first and second storage nodes by activating said first transistor.

6. The memory array of claim 3, wherein the non-volatile memory cell comprises:
   a first resistive element coupled in series with a second transistor between the first input node and a first voltage level; and
   a second resistive element coupled in series with a third transistor between the second input node and the first voltage level.

7. The memory array of claim 3, wherein said first volatile memory cell comprises:
   a fourth transistor coupled between said first storage node and the first input node of the non-volatile memory cell;
   a fifth transistor coupled between said second storage node and the second input node of the non-volatile memory cell, wherein the control circuit is adapted to couple the first non-volatile memory cell to the first and second storage nodes by activating said fourth and fifth transistors.

8. The memory array of claim 7, wherein:
   the first input node is connected to the first bit line;
   the second input node is connected to the second bit line;
   the first storage node is coupled to the first bit line via said fourth transistor; and
   the second storage node is coupled to the second bit line via said fifth transistor.

9. The memory array of claim 7, wherein:
   the first input node is connected to a first internal node;
   the second input node is connected to a second internal node;
   the first storage node is coupled to the first internal node via said fourth transistor;
   the second storage node is coupled to the second internal node via said fifth transistor;
   the first internal node is coupled to the first bit line via a sixth transistor;
   the second internal node is coupled to the second bit line via a seventh transistor; and
   the control circuit is adapted to deactivate the sixth and seventh transistors while coupling the first non-volatile memory cell to the first and second storage nodes.

10. The memory array of claim 9, further comprising:
    a second volatile memory cell having third and fourth inverters cross-coupled between third and fourth storage nodes, the third storage node being coupled to said first internal node and the fourth storage node being coupled to said second internal node via a ninth transistor; and
    a second non-volatile memory cell having: at least one resistive element programmable to have one of at least two resistive states; a third input node connected to said first internal node; and a fourth input node connected to said second internal node.

11. The memory array of claim 1, further comprising a read/write circuit adapted to read from the first non-volatile memory cell a programmed resistive state representing a first data bit and write the first data bit to the first volatile memory cell.

12. The memory array of claim 1, wherein each of said volatile memory cells is coupled to a voltage supply rail coupled via a switch to a supply voltage level.

13. The memory array of claim 1, wherein said at least one resistive element of each of said non-volatile memory cells is one of:
    a spin transfer torque element with in-plane anisotropy;
    a spin transfer torque element with perpendicular-to-plane anisotropy; and
    a reduction oxide element.

14. A method of data back-up in the memory array of claim 1, the method comprising:
coupling, by a control circuit, the first non-volatile memory cell to the first and second storage nodes to generate a current for programming the resistive state of the at least one resistive element.

15. A method of restoring data in the memory array of claim 1, the method comprising:
reading from the first non-volatile memory cell a programmed resistive state representing a first data bit; and
writing the first data bit to the first volatile memory cell.

* * * * *